United States Patent
Symes, Jr.

(10) Patent No.: US 10,494,306 B2
(45) Date of Patent: Dec. 3, 2019

(54) HIGH-K LTCC DIELECTRIC COMPOSITIONS AND DEVICES

(71) Applicant: Ferro Corporation, Mayfield Heights, OH (US)

(72) Inventor: Walter J. Symes, Jr., Dundee, NY (US)

(73) Assignee: Ferro Corporation, Mayfield Heights, OH (US)

( * ) Notice: Subject to any disclaimer, the term of this patent is extended or adjusted under 35 U.S.C. 154(b) by 41 days.

(21) Appl. No.: 15/576,321

(22) PCT Filed: Aug. 2, 2016

(86) PCT No.: PCT/US2016/045079
§ 371 (c)(1),
(2) Date: Nov. 22, 2017

(87) PCT Pub. No.: WO2017/023890
PCT Pub. Date: Feb. 9, 2017

(65) Prior Publication Data
US 2018/0170813 A1 Jun. 21, 2018

Related U.S. Application Data

(60) Provisional application No. 62/287,583, filed on Jan. 27, 2016, provisional application No. 62/234,878, filed on Sep. 30, 2015, provisional application No. 62/201,202, filed on Aug. 5, 2015.

(51) Int. Cl.
| | |
|---|---|
| C04B 35/495 | (2006.01) |
| C04B 35/622 | (2006.01) |
| C04B 35/626 | (2006.01) |
| C04B 35/63 | (2006.01) |
| C04B 35/632 | (2006.01) |
| C04B 35/64 | (2006.01) |
| C04B 35/01 | (2006.01) |
| B05D 5/12 | (2006.01) |
| C03B 19/06 | (2006.01) |
| C03C 4/14 | (2006.01) |
| C03C 8/20 | (2006.01) |
| C03C 10/00 | (2006.01) |
| H01B 1/22 | (2006.01) |
| H03H 1/00 | (2006.01) |
| H03H 3/00 | (2006.01) |

(52) U.S. Cl.
CPC ............ *C04B 35/01* (2013.01); *B05D 5/12* (2013.01); *C03B 19/06* (2013.01); *C03C 4/14* (2013.01); *C03C 8/20* (2013.01); *C03C 10/00* (2013.01); *C03C 10/0054* (2013.01); *C04B 35/495* (2013.01); *C04B 35/6261* (2013.01); *C04B 35/6262* (2013.01); *C04B 35/6264* (2013.01); *C04B 35/62222* (2013.01); *C04B 35/62625* (2013.01); *C04B 35/62695* (2013.01); *C04B 35/63* (2013.01); *C04B 35/632* (2013.01); *C04B 35/6303* (2013.01); *C04B 35/64* (2013.01); *H01B 1/22* (2013.01); *H03H 1/0007* (2013.01); *H03H 3/00* (2013.01); *C03C 2204/00* (2013.01); *C04B 2235/3203* (2013.01); *C04B 2235/326* (2013.01); *C04B 2235/3213* (2013.01); *C04B 2235/3215* (2013.01); *C04B 2235/3232* (2013.01); *C04B 2235/3236* (2013.01); *C04B 2235/3258* (2013.01); *C04B 2235/3262* (2013.01); *C04B 2235/3267* (2013.01); *C04B 2235/3281* (2013.01); *C04B 2235/3284* (2013.01); *C04B 2235/3298* (2013.01); *C04B 2235/3409* (2013.01); *C04B 2235/3418* (2013.01); *C04B 2235/36* (2013.01); *C04B 2235/408* (2013.01); *C04B 2235/445* (2013.01); *C04B 2235/5436* (2013.01); *C04B 2235/5445* (2013.01); *C04B 2235/656* (2013.01); *C04B 2235/6567* (2013.01); *C04B 2235/6583* (2013.01); *C04B 2235/96* (2013.01)

(58) Field of Classification Search
None
See application file for complete search history.

(56) References Cited

U.S. PATENT DOCUMENTS

| | | |
|---|---|---|
| 2,726,161 A | 12/1955 | Beck et al. |
| 4,379,319 A | 4/1983 | Wilson |
| 4,425,263 A * | 1/1984 | Nazarenko ........... C09D 11/104 106/1.18 |
| 4,540,676 A | 9/1985 | Chu et al. |
| 4,816,430 A | 3/1989 | Chu |
| 4,882,305 A | 11/1989 | Chu et al. |
| 4,892,847 A | 1/1990 | Reinherz |

(Continued)

FOREIGN PATENT DOCUMENTS

| | | | |
|---|---|---|---|
| CN | 101948249 | * | 1/2011 |
| EP | 1890303 A1 | | 2/2008 |

(Continued)

OTHER PUBLICATIONS

International Search Report for corresponding PCT/US2016/045079 dated Nov. 24, 2016, one page.

(Continued)

*Primary Examiner* — Tanisha Diggs
(74) *Attorney, Agent, or Firm* — Rankin, Hill & Clark LLP

(57) ABSTRACT

Electronic devices are produced from dielectric compositions comprising a mixture of precursor materials that, upon firing, forms a dielectric material comprising a barium-titanium-tungsten-silicon oxide.

16 Claims, No Drawings

(56) References Cited

U.S. PATENT DOCUMENTS

| | | |
|---|---|---|
| 5,258,335 A | 11/1993 | Muralidhar et al. |
| 5,271,797 A | 12/1993 | Kamisawa |
| 5,296,426 A | 3/1994 | Burn |
| 5,571,767 A | 11/1996 | Wilson et al. |
| 5,599,757 A | 2/1997 | Wilson et al. |
| 5,601,673 A | 2/1997 | Alexander |
| 5,657,532 A | 8/1997 | Alexander et al. |
| 5,661,882 A | 9/1997 | Alexander |
| 5,714,246 A | 2/1998 | Shaikh et al. |
| 5,790,367 A | 8/1998 | Mateika et al. |
| 5,818,686 A | 10/1998 | Mizuno et al. |
| 5,841,625 A | 11/1998 | Hennings et al. |
| 5,994,253 A | 11/1999 | Sasaki et al. |
| 5,995,360 A | 11/1999 | Hata et al. |
| 5,998,037 A | 12/1999 | Sridharan et al. |
| 6,043,174 A | 3/2000 | Maher et al. |
| 6,078,494 A | 6/2000 | Hansen |
| 6,185,087 B1 | 2/2001 | Park et al. |
| 6,245,433 B1 | 6/2001 | Nakamura et al. |
| 6,284,216 B1 | 9/2001 | Sakai et al. |
| 6,309,995 B1 | 10/2001 | Maher et al. |
| 6,610,241 B2 | 8/2003 | Shrout et al. |
| 6,631,070 B2 | 10/2003 | Schmidt et al. |
| 6,723,673 B2 | 4/2004 | Maher et al. |
| 6,828,266 B1 | 12/2004 | Park et al. |
| 6,858,554 B2 | 2/2005 | Moon et al. |
| 7,161,795 B1 | 1/2007 | Megherhi et al. |
| 7,230,817 B2 | 6/2007 | Megherhi et al. |
| 7,521,390 B2 | 4/2009 | Symes, Jr. et al. |
| 7,541,306 B2 | 6/2009 | Koebrugge et al. |
| 7,858,548 B2 | 12/2010 | Symes, Jr. et al. |
| 8,043,721 B2 | 10/2011 | Khadilkar et al. |
| 8,101,536 B2 | 1/2012 | Kim et al. |
| 8,114,801 B2 | 2/2012 | Symes et al. |
| 8,305,731 B2 | 11/2012 | Symes, Jr. et al. |
| 9,368,280 B2 | 6/2016 | Park et al. |
| 9,613,756 B2 | 4/2017 | Nishimura et al. |
| 9,704,650 B2 | 7/2017 | Symes, Jr. |
| 9,852,848 B2 | 12/2017 | Symes, Jr. |
| 9,892,853 B2 | 2/2018 | Symes, Jr. et al. |
| 2001/0015846 A1* | 8/2001 | Morris .......... C03C 12/00 359/453 |
| 2004/0009864 A1 | 1/2004 | Cho et al. |
| 2006/0046922 A1 | 3/2006 | Ito et al. |
| 2006/0058171 A1 | 3/2006 | Izuki |
| 2006/0231803 A1* | 10/2006 | Wang .......... C03C 3/064 252/500 |
| 2007/0018776 A1 | 1/2007 | Tanaka et al. |
| 2007/0138459 A1 | 6/2007 | Wong et al. |
| 2016/0240313 A1 | 8/2016 | Symes, Jr. |
| 2017/0200557 A1 | 7/2017 | Symes, Jr. |
| 2017/0240471 A1 | 8/2017 | Symes, Jr. |
| 2018/0022650 A1 | 1/2018 | Symes, Jr. |

FOREIGN PATENT DOCUMENTS

| | | |
|---|---|---|
| JP | 6-144868 A | 5/1994 |
| JP | 2001-89187 | 4/2001 |
| JP | 2009-120485 A | 6/2009 |
| RU | 2083515 C1 | 7/1997 |

OTHER PUBLICATIONS

Espacenet bibliographic data for JP2001089187 published Apr. 3, 2001, one page.

Derwent abstract for JP06144868 published May 24, 1994, two pages.

Derwent abstract for JP2009120485 published Jun. 4, 2009, one page.

* cited by examiner

HIGH-K LTCC DIELECTRIC COMPOSITIONS AND DEVICES

BACKGROUND OF THE INVENTION

1. Field of Invention

This invention relates to dielectric compositions, and more particularly to Barium-Titanium-Silicon-Tungstate based dielectric compositions that exhibit a dielectric constant K=900-2500 and that can be used in low temperature co-fired ceramic (LTCC) applications with noble metal metallizations.

2. Description of Related Art

The state of the art materials used in LTCC systems for wireless applications use dielectrics with dielectric constant K=4-8 and with Q factors around 400-1,000 at the measuring frequency of 1 MHz. This is generally achieved by using a ceramic powder mixed with a high concentration of a BaO—CaO—$B_2O_3$ low softening temperature glass which allows the low temperature densification (900° C. or lower) of the ceramic. This large volume of glass can have the undesirable effect of lowering the K and Q values of said ceramic. Q factor=1/Df, where Df is the dielectric loss tangent. There is growing demand for dielectric materials with higher K values. However, it is more challenging to sinter higher K dielectrics at temperatures below 900° C.

SUMMARY OF THE INVENTION

This invention relates to dielectric compositions, and more particularly to a Barium-Titanium-Silicon-Tungstate based dielectric compositions that exhibit a dielectric constant K=900-2500 and that can be used in low temperature co-fired ceramic (LTCC) applications with noble metal metallizations. There is growing demand for dielectric materials with very high K values (greater than 100) for electromagnetic interference filter applications.

Broadly, the ceramic material of the invention includes a host material which is made by mixing the appropriate amounts of $BaCO_3$, $TiO_2$, $WO_3$ and $SiO_2$ precursors, milling these materials together in an aqueous medium to a particle size $D_{50}$ of about 0.2 to 1.5 μm. This slurry is dried and calcined at about 800 to 1000° C. for about 1 to 5 hours to form a host material including BaO, $TiO_2$, $WO_3$ and $SiO_2$. The resultant host material is then mechanically pulverized and mixed with fluxing agents and again milled in an aqueous medium to a particle size $D_{50}$ of about 0.5 to 1.0 μm. The milled ceramic powder is dried and pulverized to produce a finely divided powder. The resultant powder can be pressed into cylindrical pellets and fired at temperatures of about 800 to 1000° C., or 775 to about 900° C., preferably about 840° C. to about 900° C., more preferably about 820 to about 890° C., still more preferably about 845 to about 885° C., and most preferably at about 880° C. for a time of about 1 to about 200 minutes, preferably about 5 to about 100 minutes, more preferably about 10 to about 50 minutes, still more preferably about 20 to about 40 minutes and most preferably for about 30 minutes.

An embodiment of the invention is a composition comprising a mixture of precursor materials that, upon firing, forms a lead-free and cadmium-free dielectric material comprising a barium-titanium-silicon-tungsten oxide host material.

The mixture according to the preceding paragraph may also further comprise precursors such that, upon firing, the dielectric material further comprises one or more selected from the group consisting of bismuth, zinc, boron, lithium, copper and manganese. The further metals may be considered dopants.

The dielectric constant of any dielectric material is greater than 100, preferably greater than 800, more preferably greater than 900, and successively more preferably greater than 1000, 1100, 1200, 1300, 1400, 1500, 1600, 1700, 1800, 1900, 2000, 2100, 2200, 2300, 2400, 2500, 2600, 2700, 2800, 2900, 3000. More preferably the dielectric constant of any dielectric material disclosed herein is from about 900 to about 2500. This paragraph is intended to provide support for all values of dielectric constant from 800 to 3000, i.e., every value in between and all ranges in between.

In a preferred embodiment, the host material includes no lead. In an alternate preferred embodiment, the host material includes no cadmium. In a more preferred embodiment, the host material includes no lead and no cadmium.

In a preferred embodiment, the host material comprises (i) 45-80 wt % BaO, preferably 50-75 wt % BaO, more preferably 53-73 wt % BaO, still more preferably 55-70 wt % BaO (ii) 10-50 wt % $TiO_2$, preferably 20-40 wt % $TiO_2$, (iii) 0.1-30 wt % $WO_3$, preferably 0.1-25 wt % $WO_3$, more preferably 0.5-20 wt % $WO_3$, and (iv) 0.01-10 wt % $SiO_2$, preferably 0.01-7 wt % $SiO_2$, more preferably 0.05-5 wt % $SiO_2$ and still more preferably 0.2-4 wt % $SiO_2$. All values of percentage, time, temperature and other parameters in this and other paragraphs herein may be presumed to be preceded with the modifier "about" in alternate embodiments.

In another embodiment, a dielectric composition includes the host material disclosed in the preceding paragraph together with (i) 0.1-15 wt % $Bi_2O_3$, preferably 0.5-10 wt % $Bi_2O_3$, (ii) 0.1-15 wt % ZnO, preferably 0.5-10 wt % ZnO, (iii) 0.01-10 wt % $B_2O_3$, preferably 0.1-5 wt % $B_2O_3$, (iv) 0.01-10 wt % $Li_2O$ preferably 0.01-5 wt % $Li_2O$, (v) 0.01-5 wt % CuO, preferably 0.01-2 wt % CuO, and (vi) 0.01-5 wt %, preferably 0.01-2 wt % of at least one selected from the group consisting of $MnO_2$, $Mn_2O_3$ and MnO.

In another embodiment, the host dielectric material of the invention is a lead-free and cadmium-free dielectric paste comprising a solids portion wherein the solids portion comprises:
from about 53.0 wt % to about 73.0 wt % BaO;
from about 20.0 wt % to about 40.0 wt % $TiO_2$;
from about 0.5 wt % to about 20.0 wt % $WO_3$; and
from about 0.05 wt % to about 5.0 wt % $SiO_2$.

In another embodiment, the dielectric material of the invention includes the host material of the preceding paragraph together with
from about 0.1 to about 10.0 wt % $Bi_2O_3$;
from about 0.1 to about 10.0 wt % ZnO;
from about 0.01 to about 5.0 wt % $H_3BO_3$;
from about 0.01 to about 5.0 wt % $Li_2CO_3$;
from about 0.01 to about 2.0 wt % CuO; and
from about 0.01 to about 2.0 wt % of at least one selected from the group consisting of $MnO_2$, $Mn_2O_3$, and MnO.

A composition comprising a mixture of precursors that, upon firing, forms a dielectric material, the mixture further comprising:
from about 53.0 wt % to about 73.0 wt % BaO;
from about 20.0 wt % to about 40.0 wt % $TiO_2$;
from about 0.5 wt % to about 20.0 wt % $WO_3$;
from about 0.05 wt % to about 5.0 wt % $SiO_2$;
from about 0.1 to about 10.0 wt % $Bi_2O_3$;
from about 0.1 to about 10.0 wt % ZnO;

from about 0.01 to about 5.0 wt % $B_2O_3$;
from about 0.01 to about 5.0 wt % $Li_2O$;
from about 0.01 to about 2.0 wt % CuO; and
from about 0.01 to about 2.0 wt % of at least one selected from the group consisting of $MnO_2$, $Mn_2O_3$, and MnO.

Any dielectric material herein may serve as the solids portion of a dielectric paste. The dielectric pastes herein include a vehicle, as noted hereinbelow.

An embodiment of the invention is a method of forming an electronic component comprising:
  (a1) applying any dielectric composition disclosed herein to a substrate or
  (a2) applying a paste comprising any dielectric composition disclosed herein to a substrate or
  (a3) compacting a plurality of particles of any dielectric composition disclosed herein to form a monolithic composite substrate; and
  (b) firing the substrate at a temperature sufficient to sinter the dielectric composition.

An embodiment of the invention is a method of co-firing alternating layers of any dielectric material or paste disclosed elsewhere herein in combination with at least one alternating separate layer of tape or paste having a dielectric constant of less than 100 to form a multi-layer substrate wherein alternating layers have differing dielectric constants.

An embodiment of the invention is an electric or electronic component comprising, prior to firing, any dielectric material or paste disclosed herein together with a conductive paste comprising:
  a. 60-90 wt % Ag+Pd+Pt+Au,
  b. 1-10 wt % of an additive selected from the group consisting of silicides, carbides, nitrides, and borides of transition metals,
  c. 0.5-10 wt % of at least one glass frit,
  d. 10-40 wt % of an organic portion.

The electric or electronic component of the invention may be electromagnetic interference filters, high Q resonators, band pass filters, wireless packaging systems, and combinations thereof.

DETAILED DESCRIPTION OF THE INVENTION

LTCC (Low Temperature Co-fired Ceramic), is a multi-layer, glass ceramic substrate technology which is co-fired with low resistance metal conductors, such as Ag, Au, Pt or Pd, or combinations thereof, at relatively low firing temperatures (less than 1000° C.). Sometimes it is referred to as "glass ceramics" because its main composition may consist of glass and alumina or other ceramic fillers. Some LTCC formulations are recrystallizing glasses. Glasses herein may be provided in the form of frits which may be formed in situ or added to a composition. In some situations, base metals such as nickel and its alloys may be used, ideally in non-oxidizing atmospheres, such as oxygen partial pressures of $10^{-12}$ to $10^{-8}$ atmospheres. It is also possible to fire the dielectric compositions disclosed herein in ambient air. A "base metal" is any metal other than gold, silver, palladium, and platinum. Alloying metals may include Mn, Cr, Co, and/or Al.

A tape cast from a slurry of dielectric material is cut, and holes known as vias are formed to enable electrical connection between layers. The vias are filled with a conductive paste. Circuit patterns are then printed, along with co-fired resistors as needed. Multiple layers of printed substrates are stacked. Heat and pressure are applied to the stack to bond layers together. Low temperature (<1000° C.) sintering is then undertaken. The sintered stacks are sawn to final dimensions and post fire processing completed as needed.

Multilayer structures useful in automotive applications may have about 5 ceramic layers, for example 3-7 or 4-6. In RF applications, a structure may have 10-25 ceramic layers. As a wiring substrate, 5-8 ceramic layers may be used.

Dielectric Pastes.

A paste for forming the dielectric layers can be obtained by mixing an organic vehicle with a raw dielectric material, as disclosed herein. Also useful are precursor compounds (carbonates, nitrates, sulfates, phosphates) that convert to such oxides and composite oxides upon firing, as stated hereinabove. The dielectric material is obtained by selecting compounds containing these oxides, or precursors of these oxides, and mixing them in the appropriate proportions. The proportion of such compounds in the raw dielectric material is determined such that after firing, the desired dielectric layer composition may be obtained. The raw dielectric material (as disclosed elsewhere herein) is generally used in powder form having a mean particle size of about 0.1 to about 3 microns, and more preferably about 1 micron or less.

Organic Vehicle.

The pastes herein include an organics portion. The organics portion is or includes an organic vehicle, which is a binder in an organic solvent or a binder in water. The choice of binder used herein is not critical; conventional binders such as ethyl cellulose, polyvinyl butanol, ethyl cellulose, and hydroxypropyl cellulose, and combinations thereof are appropriate together with a solvent. The organic solvent is also not critical and may be selected in accordance with a particular application method (i.e., printing or sheeting), from conventional organic solvents such as butyl carbitol, acetone, toluene, ethanol, diethylene glycol butyl ether; 2,2,4-trimethyl pentanediol monoisobutyrate (Texanol®); alpha-terpineol; beta-terpineol; gamma terpineol; tridecyl alcohol; diethylene glycol ethyl ether (Carbitol®), diethylene glycol butyl ether (Butyl Carbitol®) and propylene glycol; and blends thereof, Products sold under the Texanol® trademark are available from Eastman Chemical Company, Kingsport, Tenn.; those sold under the Dowanol® and Carbitol® trademarks are available from Dow Chemical Co., Midland, Mich.

No particular limit is imposed on the organics portion of the dielectric pastes of the invention. In one embodiment the dielectric pastes of the invention include from about 10 wt % to about 40 wt % of the organic vehicle; in another, from about 10 wt % to about 30 wt %. Often the paste contains about 1 to 5 wt % of the binder and about 10 to 50 wt % of the organic solvent, with the balance being the dielectric component (solids portion). In one embodiment, the dielectric paste of the invention includes from about 60 to about 90 wt % of solids portion elsewhere disclosed, and from about 10 wt % to about 40 wt % of the organics portion described in this and the preceding paragraph. If desired, the pastes of the invention may contain up to about 10 wt % of other additives such as dispersants, plasticizers, dielectric compounds, and insulating compounds.

Filler.

In order to minimize expansion mismatch between tape layers of differing dielectric compositions, fillers such as cordierite, alumina, zircon, fused silica, aluminosilicates and combinations thereof may be added to one or more dielectric pastes herein in an amount of 1-30 wt %, preferably 2-20 wt % and more preferably 2-15 wt %.

Firing.

The dielectric stack (two or more layers) is then fired in an atmosphere, which is determined according to the type of conductor in the internal electrode layer-forming paste. Where the internal electrode layers are formed of a base metal conductor such as nickel and nickel alloys, the firing atmosphere may have an oxygen partial pressure of about $10^{-12}$ to about $10^{-8}$ atm. Sintering at a partial pressure lower than about $10^{-12}$ atm should be avoided, since at such low pressures the conductor can be abnormally sintered and may become disconnected from the dielectric layers. At oxygen partial pressures above about $10^-$ atm, the internal electrode layers may be oxidized. Oxygen partial pressures of about $10^{-11}$ to about $10^{-9}$ atm are most preferred. However, reducing atmospheres ($H_2$, $N_2$ or $H_2/N_2$) can undesirably reduce $Bi_2O_3$ from a dielectric paste to metallic bismuth.

Applications for the LTCC compositions and devices disclosed herein include band pass filters, (high pass or low pass), electromagnetic interference filters, high Q resonators, wireless packaging systems, wireless transmitters and receivers for telecommunications including cellular applications, power amplifier modules (PAM), RF front end modules (FEM), WiMAX2 modules, LTE-advanced modules, transmission control units (TCU), electronic power steering (EPS), engine management systems (EMS), various sensor modules, radar modules, pressure sensors, camera modules, small outline tuner modules, thin profile modules for devices and components, and IC tester boards. Band-pass filters contain two major parts, one a capacitor and the other an inductor. Low K material is good for designing the inductor, but not suitable for designing a capacitor due the requirement for more active area to generate sufficient capacitance. High K material will result in the opposite.

EXAMPLES

The following examples are provided to illustrate preferred aspects of the invention and are not intended to limit the scope of the invention.

As seen in the tables below, appropriate amounts of $BaCO_3$, $TiO_2$, $WO_3$ and $SiO_2$, are mixed, then milled together in an aqueous medium to a particle size $D_{50}$ of about 0.2 to 1.5 µm. This slurry is dried and calcined at about 800 to 1000° C. for about 1 to 5 hours to form the host material including BaO, $TiO_2$, $WO_3$ and $SiO_2$. The resultant host material is then mechanically pulverized and mixed with fluxing agents and again milled in an aqueous medium to a particle size $D_{50}$ of about 0.5 to 1.0 µm. The milled ceramic powder is dried and pulverized to produce a finely divided powder. The resultant powder is pressed into cylindrical pellets and fired at a temperature of about 880° C. for about 30 minutes. Formulations are given in weight percent.

TABLE 1

Hosts A and B Compositions in wt %.

| | Host | |
|---|---|---|
| | A | B |
| BaO | 62.66 | 65.23 |
| $TiO_2$ | 28.63 | 33.52 |
| $WO_3$ | 7.72 | 1.11 |
| $SiO_2$ | 0.99 | 0.14 |

TABLE 2

Dielectric Formulations 1 & 2.

| | Formulation | |
|---|---|---|
| | 1 | 2 |
| Host A | 94.27 wt % | — |
| Host B | — | 93.47 wt % |
| $Bi_2O_3$ | 1.88 wt % | 2.09 wt % |
| ZnO | 1.86 wt % | 2.29 wt % |
| $H_3BO_3$ | 0.92 wt % | 0.99 wt % |
| $Li_2CO_3$ | 0.93 wt % | 1.00 wt % |
| CuO | 0.09 wt % | 0.10 wt % |
| MnO | 0.05 wt % | 0.06 wt % |

Table 3 presents electrical properties of sintered disc of formulations 1 & 2 set forth in Table 2 fired at 880° C. for 30 minutes.

TABLE 3

K, Q and Df Data for the disc of formulations 1 & 2 sintered at 880° C. for 30 minutes:

| Sintered Disc of Formulation 1 | | Sintered Disc of Formulation 2 | |
|---|---|---|---|
| K @ 1 KHz | 1188 | K @ 1 KHz | 2229 |
| Q @ 1 KHz | 110 | Q @ 1 KHz | 85 |
| Df % @ 1 KHz | 0.9 | Df % @ 1 KHz | 1.2 |

Table 4 is the composition of the formulations 1 & 2 after heating at 880° C. for 30 minutes.

TABLE 4

Composition of formulations 1 & 2 after heating at 880° C. for 30 minutes:

| | Formulation 1 after heating at 880° C. for 30 minutes | Formulation 2 after heating at 880° C. for 30 minutes |
|---|---|---|
| BaO | 59.63 wt % | 61.61 wt % |
| $TiO_2$ | 27.25 wt % | 31.66 wt % |
| $WO_3$ | 7.35 wt % | 1.05 wt % |
| $SiO_2$ | 0.95 wt % | 0.14 wt % |
| $Bi_2O_3$ | 1.90 wt % | 2.11 wt % |
| ZnO | 1.88 wt % | 2.31 wt % |
| $B_2O_3$ | 0.52 wt % | 0.57 wt % |
| $Li_2O$ | 0.38 wt % | 0.41 wt % |
| CuO | 0.09 wt % | 0.09 wt % |
| MnO | 0.05 wt % | 0.05 wt % |

The invention is further defined by the following items.

Item 1. A composition comprising a mixture of precursors that, upon firing, forms a dielectric material comprising barium-titanium-tungsten-silicon oxide.

Item 2. The composition according to item 1, wherein the mixture further comprises precursors such that, upon firing, the dielectric material further comprises one or more dopants selected from the group consisting of bismuth, zinc, boron, lithium, copper and manganese.

Item 3. The composition according to items 1 or 2, wherein the dielectric material exhibits a dielectric constant greater than 800.

Item 4. The composition according to items 1 or 2, wherein the dielectric material exhibits a dielectric constant greater than 900.

Item 5. The composition according to items 1 or 2, wherein the dielectric material exhibits a dielectric constant of from about 900 to about 2500.

Item 6. The composition according to item 1 comprising a mixture of precursors that, upon firing, forms a dielectric material comprising:
   from about 53.0 wt % to about 73.0 wt % BaO;
   from about 20.0 wt % to about 40.0 wt % $TiO_2$;
   from about 0.5 wt % to about 20.0 wt % $WO_3$; and
   from about 0.05 wt % to about 5.0 wt % $SiO_2$.

Item 7. The composition according to item 6, wherein the mixture of precursors further comprises precursors such that, upon firing, result in the dielectric material further comprises at least one selected from the group consisting of:
   from about 0.5 to about 10.0 wt % $Bi_2O_3$;
   from about 0.5 to about 10.0 wt % ZnO;
   from about 0.01 to about 5.0 wt % $B_2O_3$;
   from about 0.01 to about 5.0 wt % $Li_2O$;
   from about 0.01 to about 2.0 wt % CuO; and
   from about 0.01 to about 2.0 wt % of at least one selected from the group consisting of $MnO_2$, $Mn_2O_3$, and MnO.

Item 8. The composition according to item 2 comprising a mixture of precursors that, upon firing, forms a dielectric material comprising:
   from about 53.0 wt % to about 73.0 wt % BaO;
   from about 20.0 wt % to about 40.0 wt % $TiO_2$;
   from about 0.5 wt % to about 20.0 wt % $WO_3$;
   from about 0.05 wt % to about 5.0 wt % $SiO_2$;
   from about 0.1 to about 10.0 wt % $Bi_2O_3$;
   from about 0.1 to about 10.0 wt % ZnO;
   from about 0.01 to about 5.0 wt % $B_2O_3$;
   from about 0.01 to about 5.0 wt % $Li_2O$;
   from about 0.01 to about 2.0 wt % CuO; and
   from about 0.01 to about 2.0 wt % of at least one selected from the group consisting of $MnO_2$, $Mn_2O_3$, and MnO.

Item 9. A lead-free and cadmium-free dielectric paste comprising a solids portion wherein the solids portion comprises:
   from about 53.0 wt % to about 73.0 wt % BaO;
   from about 20.0 wt % to about 40.0 wt % $TiO_2$;
   from about 0.5 wt % to about 20.0 wt % $WO_3$; and
   from about 0.05 wt % to about 5.0 wt % $SiO_2$.

Item 10. The lead-free and cadmium-free dielectric paste of item 9, further comprising, at least one selected from the group consisting of:
   from about 0.1 to about 10.0 wt % $Bi_2O_3$;
   from about 0.1 to about 10.0 wt % ZnO;
   from about 0.01 to about 5.0 wt % $H_3BO_3$;
   from about 0.01 to about 5.0 wt % $Li_2CO_3$;
   from about 0.01 to about 2.0 wt % CuO; and
   from about 0.01 to about 2.0 wt % of at least one selected from the group consisting of $MnO_2$, $Mn_2O_3$, and MnO.

Item 11. A lead-free and cadmium-free dielectric paste comprising a solids portion, wherein the solids portion comprises:
   from about 53.0 wt % to about 73.0 wt % BaO;
   from about 20.0 wt % to about 40.0 wt % $TiO_2$;
   from about 0.5 wt % to about 20.0 wt % $WO_3$;
   from about 0.05 wt % to about 5.0 wt % $SiO_2$;
   from about 0.1 to about 10.0 wt % $Bi_2O_3$;
   from about 0.1 to about 10.0 wt % ZnO;
   from about 0.01 to about 5.0 wt % $H_3BO_3$;
   from about 0.01 to about 5.0 wt % $Li_2CO_3$;
   from about 0.01 to about 2.0 wt % CuO; and
   from about 0.01 to about 2.0 wt % of at least one selected from the group consisting of $MnO_2$, $Mn_2O_3$, and MnO.

Item 12. A method of forming an electronic component comprising:
   applying any dielectric paste of items 9-11 to a substrate; and firing the substrate at a temperature sufficient to sinter the dielectric paste.

Item 13. The method of item 12, wherein the firing is conducted at a temperature of from about 800° C. to about 1000° C.

Item 14. The method of item 12, wherein the firing is conducted in air.

Item 15. The composition according to item 1 comprising a mixture of precursors that, upon firing, forms a dielectric material comprising:
   from about 53.0 wt % to about 73.0 wt % BaO;
   from about 20.0 wt % to about 40.0 wt % $TiO_2$;
   from about 0.5 wt % to about 20.0 wt % $WO_3$; and
   from about 0.05 wt % to about 5.0 wt % $SiO_2$.

Item 16. The composition according to item 15, wherein the mixture of precursors further comprises at least one selected from the group consisting of:
   from about 0.1 to about 10.0 wt % $Bi_2O_3$;
   from about 0.1 to about 10.0 wt % ZnO;
   from about 0.01 to about 5.0 wt % $H_3BO_3$;
   from about 0.01 to about 5.0 wt % $Li_2CO_3$;
   from about 0.01 to about 2.0 wt % CuO; and
   from about 0.01 to about 2.0 wt % of at least one selected from the group consisting of $MnO_2$, $Mn_2O_3$, and MnO.

Item 17. The composition according to item 16 wherein the mixture of precursors comprise:
   from about 53.0 wt % to about 73.0 wt % BaO;
   from about 20.0 wt % to about 40.0 wt % $TiO_2$;
   from about 0.5 wt % to about 20.0 wt % $WO_3$;
   from about 0.05 wt % to about 5.0 wt % $SiO_2$;
   from about 0.1 to about 10.0 wt % $Bi_2O_3$;
   from about 0.1 to about 10.0 wt % ZnO;
   from about 0.01 to about 5.0 wt % $H_3BO_3$;
   from about 0.01 to about 5.0 wt % $Li_2CO_3$;
   from about 0.01 to about 2.0 wt % CuO; and
   from about 0.01 to about 2.0 wt % of at least one selected from the group consisting of $MnO_2$, $Mn_2O_3$, and MnO.

Item 18. A lead-free and cadmium-free dielectric paste comprising a solids portion wherein the solids portion comprises:
   from about 53.0 wt % to about 73.0 wt % BaO;
   from about 20.0 wt % to about 40.0 wt % $TiO_2$;
   from about 0.5 wt % to about 20.0 wt % $WO_3$; and
   from about 0.05 wt % to about 5.0 wt % $SiO_2$.

Item 19. The lead-free and cadmium-free dielectric paste of item 18, further comprising at least one selected from the group consisting of:
   from about 0.1 to about 10.0 wt % $Bi_2O_3$;
   from about 0.1 to about 10.0 wt % ZnO;
   from about 0.01 to about 5.0 wt % $H_3BO_3$;
   from about 0.01 to about 5.0 wt % $Li_2CO_3$;
   from about 0.01 to about 2.0 wt % CuO; and
   from about 0.01 to about 2.0 wt % of at least one selected from the group consisting of $MnO_2$, $Mn_2O_3$, and MnO.

Item 20. A lead-free and cadmium-free dielectric paste comprising a solids portion wherein the solids portion comprises:
   from about 53.0 wt % to about 73.0 wt % BaO;
   from about 20.0 wt % to about 40.0 wt % $TiO_2$;
   from about 0.5 wt % to about 20.0 wt % $WO_3$;
   from about 0.05 wt % to about 5.0 wt % $SiO_2$;
   from about 0.1 to about 10.0 wt % $Bi_2O_3$;
   from about 0.1 to about 10.0 wt % ZnO;
   from about 0.01 to about 5.0 wt % $H_3BO_3$;
   from about 0.01 to about 5.0 wt % $Li_2CO_3$;
   from about 0.01 to about 2.0 wt % CuO; and.

from about 0.01 to about 2.0 wt % of at least one selected from the group consisting of $MnO_2$, $Mn_2O_3$, and MnO.

Item 21. A method of forming an electronic component comprising:
applying any of the dielectric paste of items 1-20 to a substrate; and firing the substrate at a temperature sufficient to sinter the dielectric paste.

Item 22. The method of item 21, wherein the firing is conducted at a temperature of from about 800° C. to about 1000° C.

Item 23. The method of items 21 or 22, wherein the firing is conducted in air.

Item 24. The lead-free and cadmium-free dielectric material of any of items 1-20, wherein, after firing, the fired composition exhibits a dielectric constant K of 100-3000.

Item 25. An electric or electronic component comprising, prior to firing, the lead-free and cadmium-free dielectric material or paste of any of items 1-20, together with a conductive paste comprising:
60-90 wt % Ag+Pd+Pt+Au,
1-10 wt % of an additive selected from the group consisting of silicides, carbides, nitrides, and borides of transition metals,
0.5-10 wt % of at least one glass frit,
10-40 wt % of an organic portion.

Item 26. The electric or electronic component of item 25, wherein the electric or electronic component is selected from the group consisting of electromagnetic interference filters, high Q resonators, band pass filters, wireless packaging systems, and combinations thereof.

Item 27. A method of forming an electronic component comprising:
(a1) applying dielectric composition of any of items 1-20 to a substrate or
(a2) applying a tape comprising the dielectric composition of any of items 1-21 to a substrate or
(a3) compacting a plurality of particles of the dielectric composition of any of items 1-21 to form a monolithic composite substrate; and
(b) firing the substrate at a temperature sufficient to sinter the dielectric composition.

Item 28. The method of item 27, wherein the firing is conducted at a temperature of from about 800° C. to about 1000° C.

Item 29. The method of item 28, wherein the firing is conducted at a temperature of from about 840° C. to about 900° C.

Item 30. The method of any of items 27-29, wherein the firing is conducted in air.

Item 31. A method of co-firing at least one layer of the dielectric material of any of items 1-21 in combination with at least one alternating separate layer of tape or paste having a dielectric constant of less than 100 to form a multi-layer substrate wherein alternating layers have differing dielectric constants.

Item 32. The method of item 31, wherein the firing is conducted at a temperature of from about 800° C. to about 1000° C.

Item 33. The method of item 32, wherein the firing is conducted at a temperature of from about 840° C. to about 900° C.

Item 34. The method of any of items 31-33, wherein the firing is conducted in air.

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

The invention claimed is:

1. A composition comprising a mixture of precursors that, upon firing, forms a dielectric material comprising:
from 57.0 wt % to 73.0 wt % BaO;
from 20.0 wt % to 40.0 wt % $TiO_2$;
from 0.5 wt % to 20.0 wt % $WO_3$;
from 0.05 wt % to 5.0 wt % $SiO_2$;
from 0.1 to 10.0 wt % $Bi_2O_3$;
from 0.1 to 10.0 wt % ZnO;
from 0.01 to 4.0 wt % $B_2O_3$;
from 0.01 to 5.0 wt % $Li_2O$;
from 0.01 to 2.0 wt % CuO; and
from 0.01 to 2.0 wt % of at least one selected from the group consisting of $MnO_2$, $Mn_2O_3$, and MnO.

2. A lead-free and cadmium-free dielectric paste comprising a solids portion, wherein the solids portion comprises the composition of claim 1.

3. An electric or electronic component comprising, prior to firing, the composition of claim 1, together with a conductive paste comprising:
60-90 wt % Ag+Pd+Pt+Au,
1-10 wt % of an additive selected from the group consisting of silicides of transition metals, carbides of transition metals, nitrides of transition metals, and borides of transition metals,
0.5-10 wt % of at least one glass frit,
10-40 wt % of an organic portion.

4. An electric or electronic component comprising, prior to firing, the lead-free and cadmium-free dielectric paste of claim 2, together with a conductive paste comprising:
60-90 wt % Ag+Pd+Pt+Au,
1-10 wt % of an additive selected from the group consisting of silicides of transition metals, carbides of transition metals, nitrides of transition metals, and borides of transition metals,
0.5-10 wt % of at least one glass frit,
10-40 wt % of an organic portion.

5. A method of forming an electronic component comprising:
applying the composition of claim 1 to a substrate; and
firing the substrate at a temperature sufficient to sinter the composition.

6. The method of claim 5, wherein the firing is conducted at a temperature of from 800° C. to 1000° C.

7. The method of claim 6, wherein the firing is conducted in air.

8. A method of forming an electronic component comprising:
applying the paste of claim 2 to a substrate; and
firing the substrate at a temperature sufficient to sinter the paste.

9. The method of claim 8, wherein the firing is conducted at a temperature of from 800° C. to 1000° C.

10. A composition comprising a mixture of precursors, the mixture of precursors comprising:
from 57.0 wt % to 73.0 wt % BaO;
from 20.0 wt % to 40.0 wt % $TiO_2$;
from 0.5 wt % to 20.0 wt % $WO_3$;
from 0.05 wt % to 5.0 wt % $SiO_2$;
from 0.1 to 10.0 wt % $Bi_2O_3$;
from 0.1 to 10.0 wt % ZnO;
from 0.01 to 4.0 wt % $H_3BO_3$;
from 0.01 to 5.0 wt % $Li_2CO_3$;
from 0.01 to 2.0 wt % CuO; and from 0.01 to 2.0 wt % of at least one selected from the group consisting of $MnO_2$, $Mn_2O_3$, and MnO.

11. A lead-free and cadmium-free-dielectric paste comprising a solids portion, the solids portion comprising the composition of claim 10.

12. An electric or electronic component comprising, prior to firing, the composition of claim 10, together with a conductive paste comprising:
   60-90 wt % Ag+Pd+Pt+Au,
   1-10 wt % of an additive selected from the group consisting of silicides of transition metals, carbides of transition metals, nitrides of transition metals, and borides of transition metals,
   0.5-10 wt % of at least one glass frit,
   10-40 wt % of an organic portion.

13. A method of forming an electronic component comprising:
   applying the composition of claim 10 to a substrate; and
   firing the substrate at a temperature sufficient to sinter the composition.

14. The method of claim 13, wherein the firing is conducted at a temperature of from 800° C. to 1000° C.

15. The method of claim 14, wherein the firing is conducted in air.

16. A method of forming an electronic component comprising:
   applying the paste of claim 11 to a substrate, and
   firing the substrate at a temperature sufficient to sinter the paste.

* * * * *